(12) United States Patent
Bois et al.

(10) Patent No.: US 10,178,761 B2
(45) Date of Patent: Jan. 8, 2019

(54) DEFECTED GROUND STRUCTURE TO MINIMIZE EMI RADIATION

(71) Applicant: Hewlett Packard Enterprise Development LP, Houston, TX (US)

(72) Inventors: Karl J. Bois, Fort Collins, CO (US); Benjamin Toby, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 320 days.

(21) Appl. No.: 15/141,131

(22) Filed: Apr. 28, 2016

(65) Prior Publication Data

US 2017/0318665 A1 Nov. 2, 2017

(51) Int. Cl.
| | |
|---|---|
| *H05K 1/02* | (2006.01) |
| *H05K 3/10* | (2006.01) |
| *H05K 1/11* | (2006.01) |
| *H05K 3/46* | (2006.01) |
| *H05K 3/40* | (2006.01) |

(52) U.S. Cl.
CPC ......... *H05K 1/0245* (2013.01); *H05K 1/0225* (2013.01); *H05K 1/0298* (2013.01); *H05K 1/115* (2013.01)

(58) Field of Classification Search
CPC .... H05K 1/0245; H05K 1/0218; H05K 1/115; H05K 3/46
See application file for complete search history.

(56) References Cited

U.S. PATENT DOCUMENTS

| | | |
|---|---|---|
| 6,125,044 A | 9/2000 | Cherniski et al. |
| 7,327,208 B2 | 2/2008 | Shi et al. |
| 9,118,516 B1 | 8/2015 | Ao et al. |
| 2015/0229288 A1 | 8/2015 | Kisner et al. |
| 2015/0359084 A1* | 12/2015 | Kashiwakura .......... H01P 3/026 333/246 |

OTHER PUBLICATIONS

Liu, Wie-Tzong et al., "An Embedded Common-mode Suppression Filter for Ghz Differential Signals Using Periodic Defected Ground Plane", IEEE Microwave and Wireless Components Letters, vol. 18, No. 4, Apr. 2008, 3 pp.
Weng, L.H. et al., "An Overview on Defected Ground Structure", Progress in Electromagnetics Research B, vol. 7, 2008, pp. 173-189.
Breed, Gary, "An Introduction to Defected Ground Structures in Microstrip Circuits", High Frequency Electronics, Nov. 2008, 3 pp.

* cited by examiner

*Primary Examiner* — Hoa C Nguyen
*Assistant Examiner* — Amol Patel
(74) *Attorney, Agent, or Firm* — Michael A. Dryja

(57) ABSTRACT

A multiple-layer circuit board has a signaling layer, an exterior layer, and a ground layer. A pair of differential signal lines implemented as strip lines are within the signaling layer, and propagate electromagnetic interference (EMI) along the signaling layer. An element conductively extends inwards from the exterior layer, and as an antenna radiates the EMI propagated by the strip lines along the signaling layer outwards from the circuit board. A defected ground structure within the ground layer has a size, shape, and a location in relation to the element to suppress the EMI propagated by the strip lines to minimize the EMI that the element radiates outwards as the antenna.

16 Claims, 2 Drawing Sheets

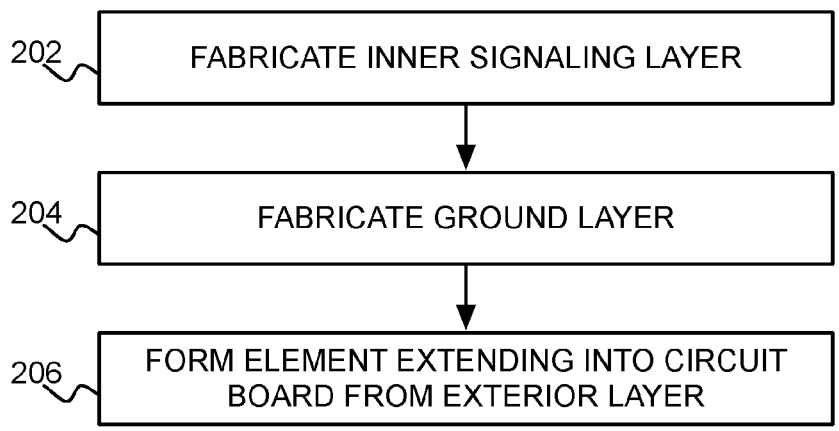
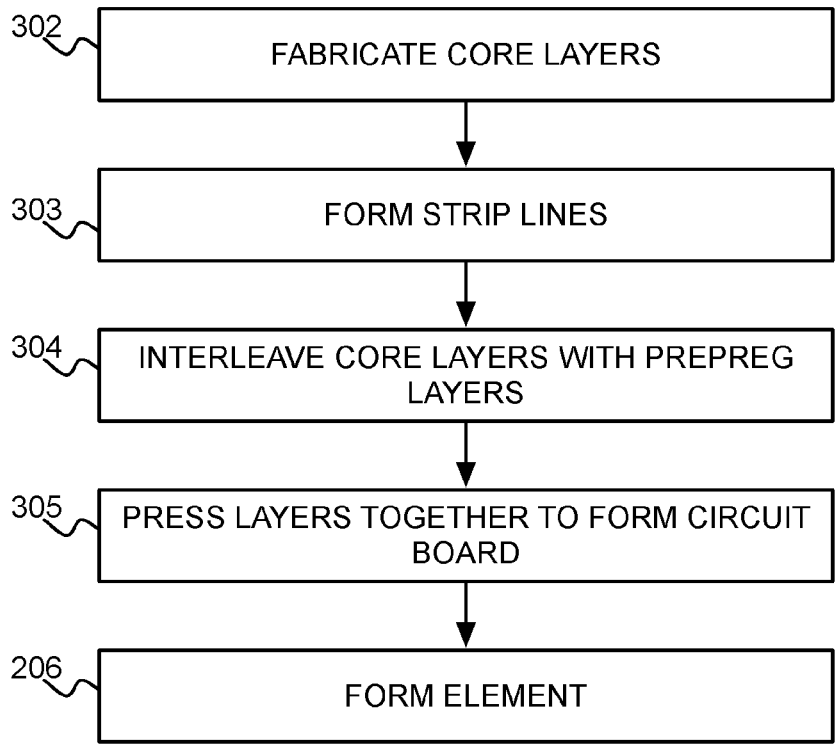
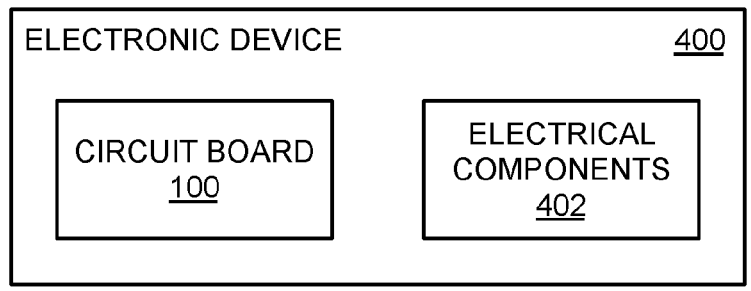

DEFECTED GROUND STRUCTURE TO MINIMIZE EMI RADIATION

BACKGROUND

Electronic devices commonly include circuit boards, such as printed circuit boards. The circuit boards have electrical components like integrated circuits (ICs), capacitors, resistors, and so on attached thereto which interact with one another to provide the desired functionality of the electronic devices. Signal lines are employed on or within the circuit boards to communicatively connect these electrical components.

BRIEF DESCRIPTION OF THE DRAWINGS

FIGS. 2 and 3 are flowcharts of example methods for fabricating a circuit board having a defected ground structure to reduce EMI emitted outwards from the circuit board.

FIG. 4 is a diagram of an example apparatus, such as an electronic device, which includes a circuit board having a defected ground structure to reduce or minimize EMI radiation or emission from the circuit board.

DETAILED DESCRIPTION

Figure 1A:
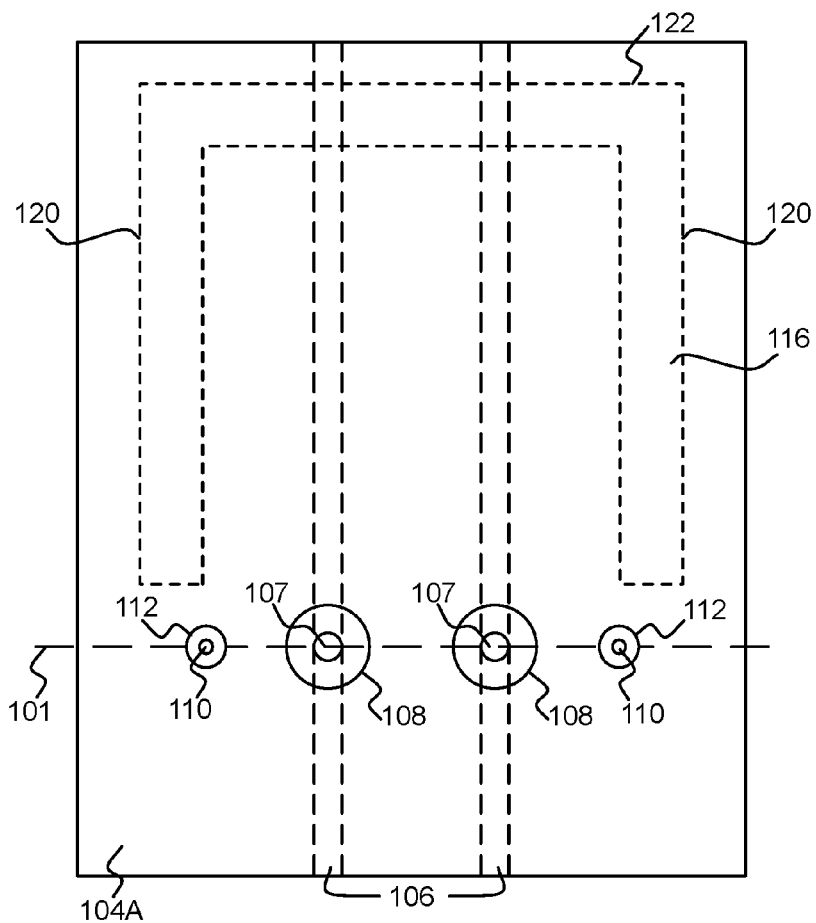
FIGS. 1A and 1B are diagrams of a top view and a cross-sectional front view, respectively, of an example circuit board having a defected ground structure to minimize radiation of electromagnetic interference (EMI).

As noted in the background, signal lines are used on or within a circuit board to conductively connect electrical components affixed to the circuit board so that an electronic device including the circuit board can provide a desired functionality. Particularly for high-frequency communication over signal lines, differential signaling can be employed. Differential signaling transmits information using two complementary signals over a pair of differential signal lines. Information is transmitted as the electrical difference between the two signals, as opposed to the difference between a signal on a single signal line and ground, as is done with single-ended signaling. Unlike single-ended signaling, differential signaling is more resistant to common mode noise, or electromagnetic interface (EMI), which commonly affects both signals.

However, differential signal lines still propagate the EMI; indeed, differential signal lines act as highly efficient radiator, such as an antenna, of such EMI. Such radiated EMI can affect other parts of an electronic device, even if the differential signaling achieved over the signal lines themselves is resistant to this EMI. Numerous techniques have been employed to shield other parts of an electronic device from such EMI conveyed by differential signal lines. For example, fabricating the differential signal lines as strip lines within an inner signaling layer of a circuit board, as opposed to as a microstrip on an exterior layer of the board, can contain the EMI within the board itself, suppressing the radiation of the EMI to great extent.

However, an inner signaling layer is still at places conductively exposed at locations at the exterior layer of a circuit board, to communicatively connect discrete electrical components attached to the circuit board at the exterior layer to the differential signal lines. For example, plated vias may extend from the exterior layer to the inner signaling layer to permit bypass capacitors, integrated circuits (ICs), and other components to conductively connect to the signaling layer. Such plated vias and other elements themselves are effectively antennas that radiate outwards from the circuit board the EMI propagated along the signaling layer within the circuit board. Even ground vias that extend from the exterior layer to an inner ground plane or layer of the circuit board can become effective antennas that radiate the EMI contained within the circuit board at the signaling layer. The EMI propagating up to the exterior layer thereafter would radiate from the exterior layer.

Existing solutions to contain the EMI within the signaling layer of a circuit board so as not to permit the EMI to radiate outwards from such elements like plated vias and ground vias have decided shortcomings. Discrete EMI chokes, for instance, only function at low frequencies, and therefore are not suitable for modern high-frequency communications. Mechanical shielding that includes placing metal covers over the elements that act as radiating antennas reduces air flow and thus impinges the ability of an electronic device to operate without overheating. Including absorbing materials within an electronic device, akin to providing an anechoic chamber for the electronic device, similarly can affect the ability to operate the electronic device coolly and increases cost of production.

Disclosed herein, by comparison, are techniques to contain EMI within a circuit board at the signaling layer without incurring these shortcomings. A defected ground structure, which is also referred to as a defective ground structure, is fabricated within the ground layer of the circuit board. The defected ground layer has a size, shape, and location in relation to a via or other EMI-radiating antenna element to suppress the EMI propagated by strip lines along and within the signaling layer. By suppressing the EMI that the strip lines propagate near the location of such an element, the defected ground layer effectively minimizes the EMI that the element radiates outwards at the external layer of the circuit board. In other words, the EMI is effectively contained within the signaling layer of the circuit board, reducing the EMI that the antenna element emits outwards from the board.

In this respect, the defected ground structure employed by the techniques described herein differs from that of existing defected ground structures. As noted above, differential signaling is advantageous over single-ended signaling because it is more resistant to common mode noise. However, such common mode EMI resistance is not perfect, and one existing defected ground structure, typically a periodic such structure that has a repeating shape at a period corresponding to a desired EMI frequency, has been used to improve the common mode noise resistance of differential signal lines.

This type of existing defected ground structure differs from the novel defected ground structures described herein. For instance, it can improve the common mode noise resistance of differential signal lines as opposed to suppressing the EMI propagated by the signal lines to minimize the amount of EMI that will ultimately radiate outward from a circuit board at an element or other via. Besides being a periodic structure, such an existing defected ground structure usually has a fairly complex shape.

Another existing defected ground structure is used in relation to microstrip differential signal lines on the exterior layer of a circuit board. Because microstrip lines are located at the circuit board's exterior layer, they themselves radiate EMI outwards from the board. Inclusion of a defected ground structure in relation to such a microstrip can mitigate this radiation, but requires a periodic structure that has a repeating shape along the length of the signal lines, since the EMI radiates along the entirety of the microstrip.

By comparison, the novel defected ground structures disclosed herein do not have to mitigate EMI radiation from the differential signal lines themselves, because the signal lines are strip lines located internally within a circuit board such that the surrounding circuit board layers already contain or prevent EMI radiation to great extent. Rather, the novel defected ground structures suppress EMI at the strip lines near elements like vias that themselves radiate the EMI outwards. As such, the novel defected ground structures do not have to have repeating shapes, because the EMI radiation of concern results at point sources such as vias as opposed to along the signal lines themselves.

Figure 1B:
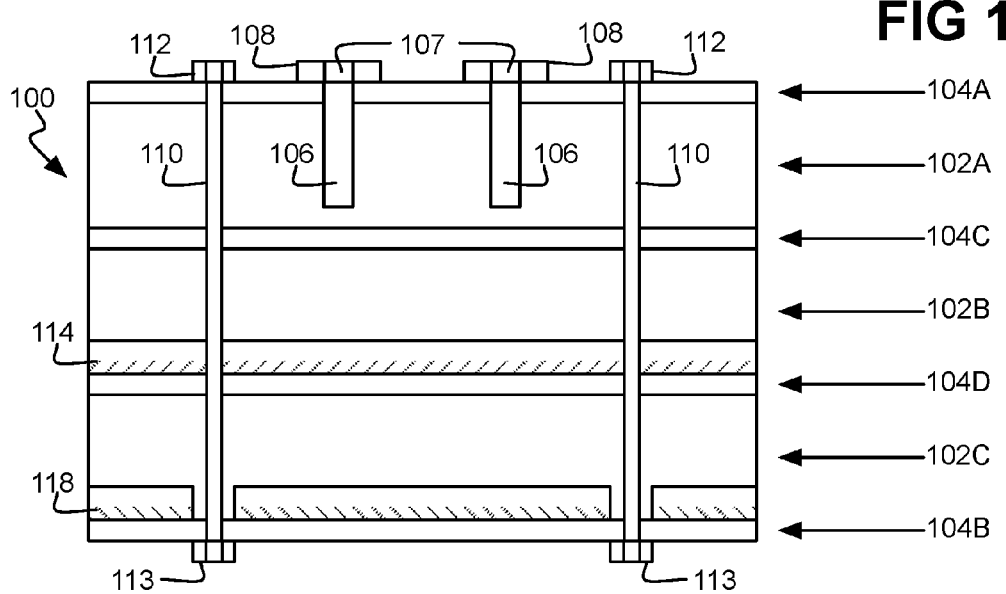

FIGS. 1A and 1B show a top view and a cross-sectional front view, respectively, of an example multiple-layer circuit board 100, such as a printed circuit board. The cross-sectional front view of FIG. 1B is at the cross-sectional line 101 of FIG. 1A. The circuit board 100 can include layers 102A, 102B, 102C, collectively referred to as the layers 102, as well as layers 104A, 104B, 104C, and 104D, collectively referred to as the layers 104. The layers 102 and the layers 104 are interleaved with one another. There may be more or fewer of the layers 102 and/or 104 than is depicted in the example of FIG. 1B.

The layers 102 may be prepreg layers, which are fiber weave layers impregnated with a resin bonding agent. The layers 104 may be core layers, including a top exterior layer 104A, a bottom exterior layer 104B, and middle layers 104C and 104D, such as glass-reinforced epoxy laminate layers of a grade such as FR4. The layers 102 effectively stick the layers 104 together. Conductive traces, such as copper traces, are formed on the layers 104, and extend into the layers 102. For instance, a conductive ground plane 114 may be disposed on the layer 104D, extending into the layer 102B. The ground plane 114 may also be referred to as a ground layer, which provides an electrical ground throughout the circuit board 100. As another example, a power plane 118 may be disposed on the layer 104B, extending into the layer 102C. The conductive power plane 118 may also be referred to as a power layer, which provides electrical power throughout the circuit board 100.

A pair of differential signal lines 106 is located within the layer 102A, which may thus be referred to as a signaling layer. Because the differential signal lines 106 are located within the circuit board 100 and not on the top of the top exterior layer 104A or on the bottom of the bottom exterior layer 104B, the signal lines 106 are strip lines as opposed to a microstrip. The signal lines 106 are depicted in FIG. 1B as partially extending through the circuit board 100, but in another implementation they can extend completely through the board 100. Connection vias 107, which may be plated, extend from the signal lines 106 within the layer 102A through the top exterior layer 104A to landing pads 108 to which an external electrical component, such as a decoupling capacitor or an IC like an application-specific IC (ASIC), can be connected.

Similarly, ground return vias 110, which may be plated, extend through the layers 102 and 104 and conductively connect to the ground plane 114 to expose the ground plane 114 on the top of the top exterior layer 104A at landing pads 112 and on the bottom of the bottom exterior layer 104B at landing pads 113. A trace to a common ground can be connected to any of the landing pads 112 and 113 to conductively tie the ground plane 114 to the common ground. The ground plane 114 can extend two dimensionally through the circuit board 100, except at a defected ground structure 116.

The defected ground structure 116 is a void defined within the ground plane 114 at which there is no conductive material. The defected ground structure 116, in other words, is an etched configuration within the conductive material of the ground plane 114. In the example of FIG. 1A, the defected ground structure 116 has a square bracket shape, having two edges 120 opposite and parallel to one another, and joined at corresponding ends via a third edge 122. The edges 120 are depicted in FIG. 1A as being equal in length, and longer than the length of the third edge 122. The distance between the edges 120 is greater than the distance between the ground return vias 110, and further is greater than the distance between the connection vias 107.

In operation, the differential signal lines 106 propagate EMI along the signaling layer 102A, even if the differential signal transmitted by the signal lines 106 is unaffected by such EMI when the EMI is common mode noise. Because the differential signal lines 106 are strip lines (i.e., the layer 102A is not the exterior layer 104A or 104B of the circuit board 100, and the lines 106 are not formed on the top of the exterior layer 104A or on the bottom of the exterior layer 104B), the EMI is largely contained within the circuit board 100. However, because the vias 107 and 110, which are more generally referred to as elements, extend inwards into the circuit board 100 from the exterior layer 104A and/or 104B, the EMI can radiate outwards from the board 100 at these elements. That is, the elements are effectively antennas that radiate the EMI propagated by the signal lines 106 (i.e., the strip lines) along the signaling layer 102A outwards from the circuit board 100 at the exterior layer 104A and/or 104B.

The defected ground structure 116 within the ground plane 114, however, has a size, shape, and location in relation to one or more of the vias 107 and 110 to suppress the EMI propagated by the signal lines 106 to minimize the EMI that these elements radiate outwards as antennas, such as at a selected or desired resonant frequency. The defected ground structure 116 is a non-periodic such structure, because it does not have a repeating shape. Since the radiation of the EMI by the signal lines 106 themselves is inhibited due to the fact that, as strip lines, the signaling lines 106 are located within the circuit board 100, periodicity of the shape can be unnecessary. Furthermore, the square bracket shape of the defected ground structure 116 is relatively simple, and complex shapes that can be difficult to fabricate may be unnecessary, as compared to for defected ground structures used to improve common mode noise resistance of differential signal lines themselves.

The example defected ground structure 116 has a size, shape, and location in relation to the vias 107 and 110 that has been shown to suppress the EMI propagated by the differential signal lines 106 to minimize the EMI that these elements radiate outwards as antennas, specifically at a resonant frequency of 9.2 gigahertz (GHz). The size of the defected ground structure 116 includes the length and width of the edges 120 and 122 relative to, for instance, the width of each signal (i.e., strip) line 106 and/or the diameter of each of the vias 107 and 110. The shape of the defected ground structure 116 is, as noted above, a square bracket shape. The location of the defected ground structure 116 is its position relative to the vias 107 and 110, such as that of the ends of the edges 120 closest to the vias 107 and 110 in relation to the locations of the vias 107 and 110 themselves, and/or that of the edge 122 in relation to the locations of the vias 107 and 110.

In general, then, a defected ground structure 116 is designed to have a size, shape, and location in relation to elements like the vias 107 and 110 that are effective antennas to suppress the EMI propagated by the differential signal lines 106 to minimize the EMI that these effective antennas radiate outwards, at a desired or selected resonant frequency. Determining the size, shape, and location of the defected ground structure 116 for a particular circuit board 100 to minimize radiation of EMI at a given resonant frequency can be achieved by, for instance, determining the total length of the defected ground structure 116, where the sum of both parallel edges 120 and the edge 122 have about one half of a wavelength within the material of the circuit board 100. The resulting defected ground structure 116 can then be tuned by changing the width of the edge 122, and moving the structure 116 with respective to the vias 110. Such optimization can be achieved via simulating is an appropriate three-dimensional (3D) electromagnetic solver tool, or by prototyping and testing.

The circuit board 100 is depicted in FIG. 1B as including one ground plane 114 having a defected ground structure 116. In another implementation, there can be multiple ground planes, such as two ground planes with one plane located adjacently below the layer at which the signal lines 106 end within the circuit board 100 and another plane located adjacently above the layer at which the signal lines 106 end within the board 100. Each such ground plane can have the same defected ground structure. Such an implementation can result in improved EMI suppression.

FIG. 2 shows an example method 200 including constituent circuit board fabrication steps, parts, or acts. Fabrication of a circuit board 100 includes fabricating an inner signaling layer, such as the layer 102A, so that it includes a pair of differential signal lines 106 that convey EMI along the layer (202). Fabrication further includes fabricating a ground layer, such as the ground plane 114, that includes a defected ground structure 116 (204), as well as forming an element, such as one or more of the vias 107 and 110, which extends into the circuit board from an exterior layer 104A and/or 104B (206). The element emits the EMI conveyed along the inner signaling layer outwards from the circuit board 100. The defected ground structure 116 has a size, shape, and location relative to the element to contain the EMI within the circuit board 100 to reduce the EMI that the element emits outwards from the board 100.

FIG. 3 shows another example method 300 for fabricating the circuit board 100. The method 300 includes fabricating core layers 104 (302). For example, the ground plane 114 may be fabricated on the core layer 104D by depositing a conductive material thereon, and then patterning and removing the conductive material selectively to form the defected ground structure 116. The power plane 118 may likewise be fabricated on the core layer 1046 by depositing and then selectively patterning and removing conductive material. The method 300 includes forming strip lines, such as the differential signal layers 106, within a prepreg layer 102A (303). For example, the prepreg layer 102A may have two parallel rows of material removed therefrom, and then filled with a conductive material via deposition, which results in the differential signal layers 106.

The method 300 includes interleaving the core layers 104 with the prepreg layers 102 (303), such as in the order depicted in FIG. 1B, and pressing the resulting stack of layers 102 and 104 together under pressure to form the circuit board 100 (304). An element, such as one or more of the vias 107 and 110, can then be formed within the circuit board 100 (206). For example, holes of the appropriate diameter and depth may be bored or otherwise formed to an appropriate depth through the layers 102 and 104 of the circuit board 100. The resulting vias can be filled or plated with a conductive material.

FIG. 4 shows an example electronic device 400, which is more generally an apparatus. The electronic device 400 includes the circuit board 100 that has been described, including the defected ground structure 116, for instance, to reduce if not eliminate EMI emissions at a selected resonant frequency from elements like the vias 107 and 110. The electronic device 400 may further include electrical components 402 that are mounted or attached to the circuit board 100, such as at landing pads 108 and 112 surrounding the vias 107 and 110, respectively. Examples of such components 402 include capacitors such as decoupling capacitors, ICs such as ASICs, as well as other types of electrical components.

The techniques disclosed herein thus minimize radiation of EMI at a selected resonant frequency from vias and other effective antennas that otherwise emit EMI which propagates along differential strip lines within a circuit board. These techniques include suppressing the EMI at the strip lines at locations near the effective antennas. Therefore, the amount of EMI that reaches the antennas is reduced, such that EMI radiation from the circuit board is reduced. EMI suppression in this respect is achieved by using a defected ground structure designed in size, shape, and location for this purpose, as opposed to, for instance, improve common mode noise rejection of the strip lines themselves.

We claim:

1. An apparatus comprising:
 a multiple-layer circuit board having a signaling layer, an exterior layer, and a ground layer;
 a pair of differential signal lines implemented as strip lines within the signaling layer, which propagate electromagnetic interference (EMI) along the signaling layer;
 an element conductively extending inwards from the exterior layer, which as an antenna radiates the EMI propagated by the strip lines along the signaling layer outwards from the circuit board;
 a defected ground structure within the ground layer and having a size, shape, and location in relation to the element to suppress the EMI propagated by the strip lines to minimize the EMI that the element radiates outwards as the antenna, wherein the shape of the defected ground structure is a square bracket shape having a first edge and a second edge parallel to one another, and a third edge perpendicular to the first edge and the second edge and connecting corresponding ends of the first edge and the second edge.

2. The apparatus of claim 1, wherein the element is a ground return via conductively extending inwards from the exterior layer to the ground layer.

3. The apparatus of claim 1, wherein the element is a connection via conductively extending inwards from the exterior layer to the signaling layer.

4. The apparatus of claim 1, wherein the size, shape, and the location of the defected ground structure in relation to the element suppress the EMI at a selected resonant frequency.

5. The apparatus of claim 1, wherein the defected ground structure is a non-periodic defected ground structure.

6. The apparatus of claim 5, wherein the first edge and the second edges are of equal length, which is longer than a length of the third edge.

7. The apparatus of claim 5, wherein the corresponding ends of the first edge and the second edge are first corresponding ends, the element is a first element, the apparatus further comprises a second element corresponding to the first element, and wherein a distance between the first edge and the second edge is greater than a distance between the first element and the second element.

8. The apparatus of claim 1, wherein the defected ground structure is a void defined within the ground layer.

9. A method comprising:
fabricating an inner signaling layer of a circuit board to include a pair of differential signal lines that convey electromagnetic interference (EMI) along the inner signaling layer;
forming an element conductively extending into the circuit board from an exterior layer of the circuit board, the element emitting the EMI conveyed along the inner signaling layer outwards from the circuit board; and
fabricating a ground layer of a multiple-layer circuit board to include a defected ground structure having a size, shape, and location in relation to the element to contain the EMI within the circuit board to reduce the EMI that the element emits outwards from the circuit board, wherein the shape of the defected ground structure is a square bracket shape having a first edge and a second edge parallel to one another, and a third edge perpendicular to the first edge and the second edge and connecting corresponding ends of the first edge and the second edge.

10. The method of claim 9, wherein forming the element comprises forming a via conductively extending inwards from the exterior layer to one of the ground layer and the signaling layer.

11. The method of claim 9, wherein fabricating the ground layer to include the defected ground structure comprises fabricating the ground layer to include a non-periodic defected ground structure.

12. The method of claim 9, wherein fabricating the ground layer to include the defected ground structure comprises fabricating the ground layer to include the defected ground structure having the size, shape, and the location in relation to the element to contain the EMI at a selected resonant frequency within the circuit board.

13. A circuit board comprising:
a signaling layer including a pair of strip lines that propagate electromagnetic interference (EMI);
an exterior layer from which an effective antenna extends inwards towards the signaling layer, the effective antenna radiating the EMI propagated by the strip lines outwards from the circuit board; and
a ground plane having a defected ground structure that has a size, shape, and location relative to the effective antenna to suppress the EMI propagated by the strip lines to reduce the EMI that the effective antenna radiates outwards, wherein the shape of the defected ground structure is a square bracket shape having a first edge and a second edge parallel to one another, and a third edge perpendicular to the first edge and the second edge and connecting corresponding ends of the first edge and the second edge.

14. The circuit board of claim 13, wherein the effective antenna is one or more of a connection via connectable to an electrical component, and a ground return via.

15. The circuit board of claim 13, wherein the size, shape, and the location of the defected ground structure in relation to the element suppress the EMI at a selected resonant frequency.

16. The circuit board of claim 13, wherein the pair of strip lines are differential signal lines.

* * * * *